United States Patent [19]
Kim et al.
[11] Patent Number: 5,041,474
[45] Date of Patent: Aug. 20, 1991

[54] EPOXY RESIN COMPOSITIONS FOR SEALING SEMICONDUCTOR DEVICES

[75] Inventors: Myung J. Kim, Seoul; Ju O. Song, Daekoo; Jung O. Park, Chungcheongnam-Do, all of Rep. of Korea

[73] Assignee: Lucky Ltd., Seoul, Rep. of Korea

[21] Appl. No.: 411,495

[22] PCT Filed: Feb. 15, 1989

[86] PCT No.: PCT/KR89/00003

§ 371 Date: Oct. 10, 1989

§ 102(e) Date: Oct. 10, 1989

[87] PCT Pub. No.: WO89/07627

PCT Pub. Date: Aug. 24, 1989

[30] Foreign Application Priority Data

Feb. 15, 1988 [KR] Rep. of Korea ..................... 88-1572

[51] Int. Cl.[5] .................... C08G 77/383; C08G 59/62; C08L 63/00; H01L 23/29

[52] U.S. Cl. .................................. 523/435; 523/428; 525/476

[58] Field of Search ....................... 523/428, 435, 476; 525/476

[56] References Cited

U.S. PATENT DOCUMENTS

| | | | |
|---|---|---|---|
| Re. 32,958 | 6/1989 | Koshii et al. | 525/476 |
| 4,511,701 | 4/1985 | Ryang | 525/487 |
| 4,701,482 | 10/1987 | Itoh et al. | 523/435 |
| 4,808,686 | 2/1989 | Cella et al. | 528/27 |
| 4,847,154 | 7/1989 | Ryang | 525/476 |
| 4,847,344 | 7/1989 | Barthelemy et al. | 528/27 |
| 4,923,912 | 5/1990 | Sasaki et al. | 525/476 |

FOREIGN PATENT DOCUMENTS

| | | | |
|---|---|---|---|
| 56-136816 | 10/1981 | Japan | 523/435 |
| 56-160054 | 12/1981 | Japan | 523/435 |
| 62-101054 | 5/1987 | Japan | 523/428 |

*Primary Examiner*—Melvyn I. Marquis
*Assistant Examiner*—David Rowley
*Attorney, Agent, or Firm*—Townsend and Townsend

[57] ABSTRACT

Disclosed are epoxy resin compositions comprising essentially (A) multi-functional epoxy resins, (B) imide-modified silicone compounds, (C) phenolic novolaks having more than 2 OH groups, and (D) inorganic fillers. When cured, these compositions have excellent processability and lower internal stress as compared to a similar composition without the imide-modified silicone compounds. These compositions are useful for sealing semiconductor devices or other molding applications.

7 Claims, No Drawings

EPOXY RESIN COMPOSITIONS FOR SEALING SEMICONDUCTOR DEVICES

TECHNICAL FIELD

The present invention relates to novel epoxy resin compositions effectively used for sealing semiconductor devices. Especially, the present invention relates to the epoxy resin compositions possessing excellent processability and lower internal stress when cured.

BACKGROUND ART

Recently, in the field of semiconductor devices, the minimization, lightening and multi-functionating of the device have been required in proportion as their high integration progress. Various resin compositions were widely used for sealing such semiconductor devices, and it has been required to further improve several characteristics of such resin composition.

For sealing semiconductor devices, epoxy resin, silicone resin, phenol resin, allylic resin such as diallyl phthalate, and the like have been used up to now. Especially, epoxy resin compositions containing phenol novolak type resins as the curing agent have been preferably used because of their good moisture resistance, electrical characteristics at high temperatures, and processability.

In case of sealing semiconductor devices with minute surfaces by using such resin compositions as sealing materials, however, it is likely that their thermal strain stress undesirably rises up during or after the transfer molding process due to the significant difference in thermal expansion coefficients between sealing materials and semiconductor devices. Because of such difference in thermal expansion coefficients the devices become strained and consequently their aluminum pattern and bonding wire may be cut, and also some cracks are formed on the surface or at the inner part of the devices. In addition to the foregoing disadvantages, the aluminum pattern becomes even corroded and the semiconductor device becomes malfunctioning at last.

Hence, in order to lower undesirable internal stress of the semiconductor devices as described above, it has been required, for example, to reduce the difference in the thermal expansion coefficients between the semiconductor device and the sealing material, to increase adhesion between the devices and the sealing material, to prevent the corrosion the corrosion of aluminum pattern by reducing ionic impurities, and so on.

Representative methods for lowering the internal thermal strain stress, which have been conventionally used, are the followings:

First, there is a method of lowering the glass transition temperature (Tg) of the resin composition used as sealing material. However, said method is limited because high temperature impact resistance of the resin composition with low Tg becomes reduced to an undesirable level and also bonding wire of the devices may be cut. Hence, it is necessary to maintain the glass transition temperature (Tg) of more than 150° C.

Another method of lowering internal stress involves reducing the difference in the thermal expansion coefficients between the semiconductor device and the resin composition for sealing, by using inorganic fillers having a low thermal expansion coefficient. However, this method also has some disadvantages: the modulus of the resin composition is increased, viscosity thereof becomes high, and consequently processability thereof is deteriorated, even though the internal stress becomes preferably lowered.

Also, available is the method of lowering modulus of the resin composition by adding a plasticizer such as long chain bisepoxy compounds like polypropylene glycol diglycidyl ether, and diglycidyl ether of bisphenol A (DGEBA) having a long side chain. However, when such plasticizers are used until the modulus sufficiently decreases, the mechanical strength and the glass transition temperature (Tg) become lowered to undesirable levels.

On the other hand, in order to protect the corrosion of aluminum pattern, it is necessary that the concentration of ionic chloride maintain lower than 10 ppm and the amount of hydrolyzable chloride be less than 0.1 part by weight.

Hereupon the present inventors have studied to overcome the foregoing problems and resultingly obtained novel epoxy resin compositions which possess lower modulus and thermal expansion coefficient and maintain high glass transition (Tg), short flash length and excellent processability, so as to be effectively used in sealing of semiconductor devices.

SUMMARY OF THE INVENTION

An object of the present invention is to provide epoxy resin compositions which are suitable as sealing materials for semiconductor devices.

DISCLOSURE OF THE INVENTION

The present invention relates to epoxy resin compositions for sealing semiconductor devices, comprising (A) 7 to 20 parts by weight of multi-functional epoxy compounds;

(B) 0.1 to 13 parts by weight of imide-modified silicone compounds;

(C) 2.5 to 15 parts by weight of phenol novolak type resins; and (D) 60 to 80 parts by weight of inorganic fillers.

The multi-functional epoxy compounds of Component(A) according to the present invention, are epoxy resins containing at least two epoxy groups in a molecule, which include glycidyl ether type epoxy resin, bisphenol-A type epoxy resin, phenol novolak type epoxy resin, cresol novolak type epoxy resin, glycidyl ester type epoxy resin, glycidyl amine type epoxy resin, linear aliphatic epoxy resin, alicyclic epoxy resin, heterocyclic epoxy resin, halogenated epoxy resin, and the like. These epoxy compounds may be used individually or in combination of two or more sorts thereof. And, the novolak type epoxy resins, having a softening temperature of 60° to 110° C. and epoxide equivalent weight of 180 to 240, are used most preferably 7 to 20 parts by weight to the total epoxy resin composition. When the amount is less than 7 parts by weight, moisture resistance of the epoxy resin composition becomes deteriorated. On the other hand, when the amount is over 20 parts by weight, mechanical strength thereof becomes reduced to an undesirable level.

The imide-modified silicone compounds of Component (B) may be prepared by reacting polysiloxane containing amine groups with imide compomound. The polysiloxanes containing amine groups include, for example, alkyl-modified silicones such as dimethyl silicone and methylphenyl silicone, epoxy-modified silicone, dimethyl diphenyl silicone, fatty acid-modified silicone, silicone/polyether copolymer, and the like.

The imide compound is a bismaleimide compound, for example, N,N'-1,3-phenylene bismaleimide, N,N'-4,4'-diphenyl methane bismaleimide, N,N'-4,4'-diphenyl sulfone bismaleimide, N,N-4,4'-dicyclohexyl methane bismaleimide, N,N'-4,4'-diphenylcyclohexane bismaleimide, N,N-1,3-xylilene bismaleimide, 2,4-bismaleimide toluene, 2,6-bismaleimide toluene, and the like.

The amount of the imide-modified silicone compounds is preferably 0.1 to 13 parts by weight to the total epoxy resin composition. When the amount is less than 0.1 part by weight, sufficient decrease of internal stress cannot be obtained, and on the other hand, when the amount is over 13 parts by weight, processability and flowability of the epoxy resin composition become deteriorated to an undesirable level.

In the present invention, the imide-modified silicone compound(B) prepared by the foregoing method can also be used as the form of imidized silicone-modified epoxy resin which is obtained by reacting it with the multi-functional epoxy resin of Component(A).

In case of using the imide-modified silicone compounds to prepare the sealing material for semiconductor devices, the sealing material possesses much improved flowability and dramatically reduced flash when molded, comparing to the case of non-modified silicone compounds.

And, the phenol novolak type resin of Component(C), which is used as the curing agent in the present invention, includes phenol novolak resin, cresol novolak resin, tetrabutyl phenol novolak resin and the like whose softening temperature ranges from 60° to 110° C.

The amount of the phenol novolak type resin is preferably 2.5 to 15 parts by weight to the total epoxy resin composition. At this moment, it is important to control the ratio of the number of reactive groups (i.e. acid anhydride, hydroxy group in phenol, and amino group) to the number of epoxy groups in the multi-functional epoxy compound(A) within the range of 0.5 to 1.5, more preferably 0.7 to 1.2. When the ratio is less than 0.5, mechanical strength of the epoxy resin composition drops, and on the other hand, when the ratio is over 1.5, various properties such as moisture resistance are deteriorated undesirably.

The inorganic filler of Component(D) according to the present invention, includes, for example, fused silica, zirconium oxide, clay, alumina, calcium carbonate, crystalline silica, glass, aluminum hydroxide, magnesite, plaster, graphite, cement, mica, quartz sand, kaolin, asbestos, and the like. These inorganic fillers may be used individually or in combination of two or more sorts thereof.

The amount of the inorganic filler is preferably 60 to 80 parts by weight of the total epoxy resin composition. When the amount is less than 60 parts by weight, some cracks are formed due to the large thermal expansion coefficient, and also heat resistance of the resin composition becomes reduced. And, when the amount is over 80 parts by weight, the flowability of the resin composition deteriorates and hence it is difficult to effectively seal semiconductor devices.

The epoxy resin compositions according to the present invention comprise essential Components (A) to (D), and may comprise additionally catalysts like curing accelerators, for example, imidazole compounds such as imidazole, 2-methyl imidazole, 2-ethyl imidazole, 1,2-methyl imidazole, 2-ethyl-4-methyl imidazole and 2-phenyl imidazole; amine compounds such as triethyl amine, diethylene triamine, triethylene tetraamine and N-amino-ethyl piperazine; complex compounds of triethylamine and boron trifluoride; organic phosphine compounds such as triphenyl phosphine, tributyl phosphine, methyldiphenyl phosphine, butylphenyl phosphine, dimethyl phosphine, phenyl phosphine and octyl phosphine. These catalysts may be used individually or in combination of two or more compounds thereof. When the amount of the catalysts is less than 0.1 part by weight, the curing velocity of the resin composition becomes remarkably reduced. On the other hand, when the amount is over 5 parts by weight, moisture resistance thereof becomes deteriorated.

And, the epoxy resin composition may also comprise other additives in order to further improve the properties of the epoxy resin composition, for example, releasing agents such as natural wax, synthetic wax, higher fatty acids and their metallic salts; flame retardants such as cholorinated paraffine, bromotoluene, hexabromo benzene, brominated epoxy resin and antimony trioxide; coloring agents such as carbon black, expecially acetylene black or furnace black; and coupling agents, for example, silane coupling agents such as epoxy silane, vinyl silane and amine silane, and the like.

According to the present invention, the epoxy resin composition may be easily prepared by homogeneously mixing the foregoing essential (or with additional) components using a mixer such as rolls, a kneader, and the like.

When the epoxy resin composition was processed by the transfer molding machine, as mentioned above, the cured epoxy resin composition has not only good genereal properties such as moisture resistance, mechanical strength and heat conductivity but also higher glass transition temperature (Tg), lower thermal expansion coefficient and modulus. Moreover, it is a further advantage that flash produced during molding gets remarkably reduced.

BEST MODE FOR CARRYING OUT THE INVENTION

The present invention will be illustrated with the following Examples and Comparative Examples. Hereinafter, the "part" means the "part by weight".

The material properties of the resin compositions obtained by the Examples and Comparative Examples are evaluated by the method as following:

Flexural Modulus: ASTM D-790
Flexural Strength: ASTM D-790
Thermal Expansion Coefficient: JIS K-6911
Glass Transition Temperature (Tg): JIS K-6911
Spiral Flow: EMMI-1-66 (Epoxy Molding Material Institute; Society of Plastic Industry)
Flash length: Determined by measuring a flash when molded using the transfer molding machine under the conditions of 175° C., 70 kg/cm$^2$ and 150 sec., in which the mold for measuring flash lengths has 0.01 inch and 0.005 inch gaps.

EXAMPLE 1

10.8 parts of cresol novolak epoxy resin having epoxide equivalent weight of 213 and a softening temperature of 79° C., 2.7 parts of brominated novolak epoxy resin having epoxide equivalent weight of 360 and a softening temperature of 92° C., 7.5 parts of phenol novolak resin, 6.5 parts of imidized silicone-modified epoxy, 68.0 parts of fused silica, 3.0 parts of antimony trioxide, 0.3 parts of carbon black, 0.2 parts of triphenyl phosphine, 0.5 parts of sillane coupling agent and 0.4 parts of carnauba wax, as listed in Table 1, were homogeneously mixed in a mixer, then the mixture was kneaded in rolls heated to 85° ~ 95° C., rapidly cooled to room temperature, and finely pulverized to obtain the epoxy resin composition of the present invention.

Thus obtained composition was cured at 175° C. for 150 seconds into test specimens by using a transfer molding machine. The test speciments were post-cured for 8 hours at 175° C., and then used for measuring the material properties. The results were shown in Table 1.

EXAMPLE 2

Following the procedure of Example 1 but using 8.5 parts of cresol novolak epoxy resin and 6.5 parts of imidized silicone-modified epoxy as listed in Table 1, the epoxy resin composition of the present invention was prepared.

The material properties thereof were evaluated by the same method as in Example 1, and the results were shown in Table 1.

EXAMPLE 3

Following the procedure of Example 1 but using 7.5 parts of cresol novolak epoxy resin, 8.5 parts of phenol novolak resin, 9.8 parts of imidized silicone-modified epoxy and 67.0 parts of fused silca as listed in Table 1, the epoxy resin composition of the present invention was prepared.

The material properties thereof were evaluated by the same method as in Example 1, and the results were shown in Table 1.

EXAMPLE 4

Following the procedure of Example 1 but using 5.0 parts of cresol novolak epoxy resin, 8.5 parts of the phenol novolak resin 12.5 parts of imidized silicone-modified epoxy and 67.0 parts of fused silica as listed in Table 1, the epoxy resin composition of the present invention was prepared.

The material properties thereof were evaluated by the same method as in Example 1, and the results were shown in Table 1.

EXAMPLE 5

Following the procedure of Example 1 but using 16.0 parts of cresol novolak epoxy resin and 8.0 parts of phenol novolak resin, 0.8 parts of silicone compound instead of imidized silicone-modified epoxy, and 6.0 parts of fused silica as listed in Table 1, the epoxy resin composition of the present invention was prepared.

The material properties thereof were evaluted by the same method as in Example 1, and the results were shown in Table 1.

EXAMPLE 6

Following the procedure of Example 1 but using 15.5 parts of cresol novolak epoxy resin and 8.0 parts of phenol novolak resin, and 1.3 parts of silicone compound instead of imidized silicone-modified epoxy, as listed in Table 1, the epoxy resin composition of the present invention was prepared.

The material prroperties thereof were evaluted by the same method as in Example 1, and the results were shown in Table 1.

COMPARATIVE EXAMPLE 1

Following the procedure of Example 1 but using 16.8 parts of cresol novolak epoxy resin and 8.0 parts phenol novolak resin without using imidized silicone-modified epoxy as listed in Table 1, the epoxy resin composition was prepared.

The material properties thereof were evaluated by the same method as in Example 1, and the results were shown in Table 1.

COMPARATIVE EXAMPLE 2

Following the procedure of Example 1 but using 15.8 parts of cresol novolak epoxy resin and 9.0 parts phenol novolak resin without using imidized silicone-modified epoxy as listed in Table 1, the epoxy resin composition was prepared.

The material properties thereof were evaluated by the same method as in Example 1, and the results were shown in Table 1.

COMPARATIVE EXAMPLE 3

Following the procedure of Example 1 but using 15.8 parts of cresol novloak epoxy resin, 8.0 parts of phenol novolak resin and 69.0 parts of fused silica without using imidized silicone-modified epoxy as listed in Table 1, epoxy resin composition was prepared.

The material properties thereof were evaluated by the same method as in Example 1, and the results were shown in Table 1.

COMPARATIVE EXAMPLE 4

Following the procedure of Example 1 but using 15.3 parts of cresol novloak epoxy resin and 70.0 parts of fused silica without using imidized silicone-modified epoxy as listed in Table 1, the epoxy resin composition was prepared.

The material properties thereof were evaluated by the same method as in Exmaple 1, and the results were shown in Table 1.

TABLE 1

| Components & Material Properties | Example | | | | | |
|---|---|---|---|---|---|---|
| | 1 | 2 | 3 | 4 | 5 | 6 |
| Cresol novolak epoxy resin | 10.8 | 8.5 | 7.5 | 5.0 | 16.0 | 15.5 |
| Brominated phenol novolak epoxy resin | 2.7 | 2.7 | 2.7 | 2.7 | 2.7 | 2.7 |
| Phenol novolak resin | 7.5 | 7.5 | 8.5 | 8.5 | 8.0 | 8.0 |
| Imidized silicone-modified epoxy | 6.5 | 8.8 | 9.8 | 12.5 | — | — |
| Imide-modified silicone compound | — | — | — | — | 0.8 | 1.3 |
| Fused silica | 68.0 | 68.0 | 67.0 | 67.0 | 68.0 | 68.0 |
| Antimony trioxide | 3.0 | 3.0 | 3.0 | 3.0 | 3.0 | 3.0 |
| Carbon black | 0.3 | 0.3 | 0.3 | 0.3 | 0.3 | 0.3 |
| Triphenyl phosphine | 0.2 | 0.2 | 0.2 | 0.2 | 0.2 | 0.2 |

TABLE 1-continued

| | | | | | | |
|---|---|---|---|---|---|---|
| Silane coupling agant | 0.6 | 0.6 | 0.6 | 0.6 | 0.6 | 0.6 |
| Carnauba wax | 0.4 | 0.4 | 0.4 | 0.4 | 0.4 | 0.4 |
| (unit: parts by weight) | | | | | | |
| Flexural modulus (kg/m$^3$) | 1320 | 1300 | 1290 | 1290 | 1310 | 1290 |
| Thermal expansion coefficient (/°C.) | $1.9 \times 10^{-5}$ | $1.8 \times 10^{-5}$ | $1.8 \times 10^{-5}$ | $1.7 \times 10^{-5}$ | $1.9 \times 10^{-5}$ | $1.8 \times 10^{-5}$ |
| Glass transition temperature (°C.) | 153 | 153 | 153 | 152 | 153 | 152 |

| Components & Material | Comparative Example | | | |
|---|---|---|---|---|
| Properties | 1 | 2 | 3 | 4 |
| Cresol novolak epoxy resin | 16.8 | 15.8 | 15.8 | 15.3 |
| Brominated phenol novolak epoxy resin | 2.7 | 2.7 | 2.7 | 2.7 |
| Phenol novolak resin | 8.0 | 9.0 | 8.0 | 7.5 |
| Imidized silicone-modified epoxy | — | — | — | — |
| Imide-modified silicone compound | — | — | — | — |
| Fused silica | 68.0 | 68.0 | 69.0 | 70.0 |
| Antimony trioxide | 3.0 | 3.0 | 3.0 | 3.0 |
| Carbon black | 0.3 | 0.3 | 0.3 | 0.3 |
| Triphenyl phosphine | 0.2 | 0.2 | 0.2 | 0.2 |
| Silane coupling agant | 0.6 | 0.6 | 0.6 | 0.6 |
| Carnauba wax | 0.4 | 0.4 | 0.4 | 0.4 |
| (unit: parts by weight) | | | | |
| Flexural modulus (kg/m$^3$) | 1530 | 1540 | 1570 | 1500 |
| Thermal expansion coefficient (/°C.) | $2.0 \times 10^{-5}$ | $2.0 \times 10^{-5}$ | $2.0 \times 10^{-5}$ | $1.9 \times 10^{-5}$ |
| Glass transition temperature (°C.) | 155 | 155 | 156 | 155 |

EXAMPLE 7 TO 8

Following the procedure of Example 1 but using the components and amounts thereof shown in Table 2, the epoxy resin compositions of the present invention were prepared.

Thus obtained resin compositions were used for measuring spiral flow and flash length thereof, and the results were shown in Table 2.

COMPARATIVE EXAMPLES 5 AND 6

Following the procedure of Example 1 but using the components and amounts as shown in Table 2, the epoxy resin compositions were prepared.

Thus obtained resin compositions were used for measuring spiral flow and flash length, and the results were shown in Table 2.

As shown in Tables 1 and 2, the epoxy resin compo/-sitions, which comprise imidized silicone-modified epoxy or imide-modified silicone compound, have high glass transition temperature(Tg), lower flexural modulus and thermal expansion coefficient, short flash length, and excellent processability.

TABLE 2

| | Example | | | Comparative Example | |
|---|---|---|---|---|---|
| Components & Material Properties | 7 | 8 | 9 | 5 | 6 |
| Cresol novolak epoxy resin | 16.0 | 15.5 | 16.0 | 15.5 | 15.8 |
| Brominated phenol novolak epoxy resin | 2.7 | 2.7 | 2.7 | 2.7 | 2.7 |
| Phenol novolak resin | 7.6 | 7.6 | 7.6 | 7.6 | 7.6 |
| Imide-modified silicone compound | 0.6 | 1.1 | 1.6 | — | — |
| Silicon compound | — | — | — | 1.1 | 0.8 |
| Fused silica | 68.5 | 68.6 | 67.6 | 68.6 | 68.6 |
| Antimony trioxide | 3.0 | 3.0 | 3.0 | 3.0 | 3.0 |
| Carbon black | 0.3 | 0.3 | 0.3 | 0.3 | 0.3 |
| Triphenyl phosphine | 0.2 | 0.2 | 0.2 | 0.2 | 0.2 |
| Silane coupling agant | 0.6 | 0.6 | 0.6 | 0.6 | 0.6 |
| Carnauba wax | 0.4 | 0.4 | 0.4 | 0.4 | 0.4 |
| (unit: parts by weight) | | | | | |
| Spiral flow (inch) | 39 | 37 | 39 | 30 | 30 |
| Flash length (mm)* | 0.7 | 1.9 | 1.8 | 3.8 | 3.8 |
| Flash length (mm)** | 1.3 | 1.3 | 1.3 | 3.8 | 3.2 |

<note>
*Measured by using a mold with a gap of 0.01 inch.
**Measured by using a mold with a gap of 0.005 inch.

We claim:

1. Epoxy resin compositions for sealing semiconductor devices, comprising:

(A) 7 to 20 parts by weight of multi-functional epoxy compounds;

(B) 0.1 to 13 parts by weight of imide-modified silicone compounds;

(C) 2.5 to 15 parts by weight of phenol novolak resins; and (D) 60 to 80 parts by weight of inorganic fillers 2. The epoxy resin compositions as claimed in claim 1, wherein the multi-functional epoxy compounds have epoxide equivalent weight of 180 to 240 and a softening temperature of 60° to 110° C.

3. The epoxy resin compositions as claimed in claim 1, wherein the multi-functional epoxy compounds contain at least two epoxy groups in a molecule, which are selected from the group consisting of glycidyl ether epoxy resin, cresol novolak epoxy resin, glycidyl ester epoxy resin, glycidyl amine epoxy resin, linear alphatic epoxy resin, alicyclic epoxy resin, heterocyclic epoxy resin and halogenated epoxy resin.

4. The epoxy resin compositions as claimed in claim 1, wherein the imide-modified silicone compounds are prepared by reacting polysiloxane containing amine groups with an imide compound.

5. The epoxy resin compositions as claimed in claim 4, wherein the polysiloxane is selected from the group consisting of dimethyl silicone, methylphenyl silicone, epoxy-modified silicone, dimethyl diphenyl silicone, fatty acid-modified silicone, and silicone/polyether copolymers.

6. The epoxy resin compositions as claimed in claim 4, wherein the imide compound is selected from bismaleimide compounds such as N,N-1,3-phenylene bismaleimide, N,N'-4,4'-diphenyl methane bismaleimide, N,N'-4,4'-diphenyl ether bismaleimide, N,N'-4,4'-diphenyl sulfone bismaleimide, N,N'-3,4-diphenyl sulfone bismaleimide, N,N'-4,4'-dicyclohexyl methane bismaleimide, N,N'-4,4'-diphenylcyclohexane bismaleimide, N,N'-1,3-xylilene bismaleimide, 2,4-bismaleimide toluene and 2,6-bismaleimide toluene.

7. The epoxy resin compositions as claimed in claim 1, wherein the novolak phenol resin is selected from the group consisting of phenol novolak resin, cresol novolak resin and tetrabutyl phenol novolak resin.

* * * * *